(12) United States Patent  
Nakayama et al.

(10) Patent No.: US 11,417,548 B2  
(45) Date of Patent: Aug. 16, 2022

(54) COMPONENT MOUNTING MACHINE

(71) Applicant: FUJI CORPORATION, Chiryu (JP)

(72) Inventors: Yukinori Nakayama, Hekinan (JP); Shinichi Fujii, Kariya (JP)

(73) Assignee: FUJI CORPORATION, Chiryu (JP)

( * ) Notice: Subject to any disclaimer, the term of this patent is extended or adjusted under 35 U.S.C. 154(b) by 546 days.

(21) Appl. No.: 16/488,271

(22) PCT Filed: Mar. 9, 2017

(86) PCT No.: PCT/JP2017/009616  
§ 371 (c)(1),  
(2) Date: Aug. 23, 2019

(87) PCT Pub. No.: WO2018/163388  
PCT Pub. Date: Sep. 13, 2018

(65) Prior Publication Data  
US 2020/0234984 A1 Jul. 23, 2020

(51) Int. Cl.  
*H01L 21/67* (2006.01)  
*H01L 21/683* (2006.01)  
*G05B 19/418* (2006.01)

(52) U.S. Cl.  
CPC .... *H01L 21/67144* (2013.01); *G05B 19/4183* (2013.01); *H01L 21/67276* (2013.01);  
(Continued)

(58) Field of Classification Search  
CPC ......... H01L 21/67242; H01L 21/67259; H01L 21/67265  
See application file for complete search history.

(56) References Cited

U.S. PATENT DOCUMENTS

2007/0227941 A1* 10/2007 Narita ............... H01L 21/67778  
  206/710  
2015/0187622 A1* 7/2015 Johnson ................. H01L 21/68  
  438/464  
(Continued)

FOREIGN PATENT DOCUMENTS

EP 2 020 838 A2 2/2009  
JP 3-161942 A 7/1991  
(Continued)

OTHER PUBLICATIONS

International Search Report dated May 30, 2017 in PCT/JP2017/009616 filed on Mar. 9, 2017.

*Primary Examiner* — Jae Lee  
(74) *Attorney, Agent, or Firm* — Oblon, McClelland, Maier & Neustadt, L.L.P.

(57) ABSTRACT

A component mounting machine includes a control device that controls a wafer supply device and a component transfer device. The control device includes a die information storage section storing the position of the dies stored in the wafer supply device associated with a rank of the dies, a block information acquisition section acquiring the condition of the dies to be mounted on a block provided on a board, a rank designation section designating the rank of the die to be picked up by the component transfer device, and a position designation section designating the position of the die to be picked up by the component transfer device. The position designation section designates the position of the die so that the die having the rank designated by the rank designation section is continuously picked up over the multiple wafers stored in the wafer supply device.

15 Claims, 7 Drawing Sheets

(52) U.S. Cl.
CPC .............. *H01L 21/6836* (2013.01); *G05B 2219/36195* (2013.01); *H01L 2221/68327* (2013.01)

(56) References Cited

U.S. PATENT DOCUMENTS

2015/0303084 A1* 10/2015 Iwase ................ H01L 21/67144
                                                        414/331.14
2017/0140963 A1*  5/2017 Kawasaki ......... H01L 21/67265
2018/0033658 A1*  2/2018 Maijala ................... H01L 21/68
2019/0139795 A1*  5/2019 Neo ........................ H01L 21/681

FOREIGN PATENT DOCUMENTS

| | | |
|---|---|---|
| JP | 2008-177390 A | 7/2008 |
| JP | 5614825 B1 | 10/2014 |
| WO | WO 2013/108366 A1 | 7/2013 |
| WO | WO 2013/108368 A1 | 7/2013 |
| WO | WO 2013/161173 A1 | 10/2013 |

\* cited by examiner

|  | WAFER W1 | WAFER W2 | WAFER W3 | RANK-BASED TOTAL NUMBER |
|---|---|---|---|---|
| RANK 1 | 12 | 0 | 14 | 26 |
| RANK 2 | 20 | 22 | 18 | 60 |
| RANK 3 | 28 | 33 | 30 | 91 |
| RANK 4 | 44 | 40 | 37 | 121 |
| RANK 5 | 55 | 54 | 57 | 166 |
| RANK 6 | 37 | 41 | 40 | 118 |
| RANK 7 | 24 | 31 | 29 | 84 |
| RANK 8 | 16 | 20 | 19 | 55 |
| RANK 9 | 13 | 10 | 4 | 27 |

FIG.9

|  | WAFER W1 | WAFER W2 | WAFER W3 | RANK-BASED TOTAL NUMBER |
|---|---|---|---|---|
| RANK 1 | 12 | 0 | 14 | 26 |
| RANK 2 | 20 | 22 | 18 | 60 |
| RANK 3 | 28 | 33 | 30 | 91 |
| RANK 4 | 44 | 40 | 37 | 121 |
| RANK 5 | 55 | 54 | 57 | 166 |
| RANK 6 | 37 | 41 | 40 | 118 |
| RANK 7 | 24 | 31 | 29 | 84 |
| RANK 8 | 16 | 20 | 19 | 55 |
| RANK 9 | 13 | 10 | 4 | 27 |

|  | WAFER W1 | WAFER W2 | WAFER W3 | RANK-BASED TOTAL NUMBER |
|---|---|---|---|---|
| RANK 1 | 12 | 0 | 14 | 26 |
| RANK 2 | 20 | 22 | 18 | 60 |
| RANK 3 | 28 | 33 | 30 | 91 |
| RANK 4 | 44 | 40 | 37 | 121 |
| RANK 5 | 55 | 54 | 57 | 166 |
| RANK 6 | 37 | 41 | 40 | 118 |
| RANK 7 | 24 | 31 | 29 | 76 |
| RANK 8 | 0 | 0 | 0 | 0 |
| RANK 9 | 0 | 0 | 0 | 0 |

86, 151, 212, 287, 284, 194

COMPONENT MOUNTING MACHINE

TECHNICAL FIELD

The present disclosure relates to a component mounting machine.

BACKGROUND ART

A component mounting machine is known in which a wafer divided into multiple dies (components) by a dicing process is supplied to a supply position and the dies are picked up and mounted on a board. Patent Literature 1 discloses a technique in which each pellet is sorted (ranked) into multiple categories based on electrical characteristics of the pellet (die), and the order of picking up the pellets is determined based on the categorization.

Patent Literature

Patent Literature 1: JP-A-3-161942

SUMMARY

In the technique described in Patent Literature 1, when it is necessary to mount multiple pellets having the same electrical characteristics or category classification successively on a single board and the number of pellets remaining on the wafer supplied to a supply position is insufficient, the pellets corresponding to the electrical characteristic or category classification are not picked up. Therefore, unused pellets remain on the wafer returned from the supply position. Since such unused pellets are generated each time a wafer to be supplied to a supply position is exchanged, as the number of wafers used increases, the number of unused pellets increases. As a result, supplying of the components (pellets) becomes inefficient.

In general, the die adheres to a dicing sheet provided below, and when the die is picked up, the dicing sheet is pushed up from below together with the dicing sheet. Therefore, stretching occurs at the pushed-up portion of the dicing sheet.

Therefore, if many dies have been picked up between the dies to be picked up, the distance between the dies is widened due to the stretching of the dicing sheet. In this case, the greater the distance between the dies to be picked up, the more dies will have been picked up between the dies to be picked up and the greater the distance between the dies caused by the dicing sheet will be.

In this regard, Patent Literature 1 described above describes that the selection order of pellets (dies) is changed from a category having a small capacitance range to a category having a large capacitance range. Therefore, when the number of pellets belonging to the category selected earlier is larger than the number of pellets belonging to the category selected later, there are many picked-up pellets among the pellets to be picked up when the pellets belonging to the category having a large capacitance range are picked up. As a result, pickup errors tend to occur.

An object of the present description is to provide a component mounting machine capable of efficiently supplying components and a component mounting machine capable of suppressing the occurrence of a pickup error of a component.

Solution to Problem

The present description discloses a first component mounting machine including a wafer supply device having a magazine capable of storing multiple wafers, each wafer being divided into multiple dies, and configured to supply the wafers stored in the magazine to a supply position, a component transfer device configured to pick up the dies supplied to the supply position and to mount the dies on a conveyed board, and a control device configured to control the wafer supply device and the component transfer device.

In the first component mounting machine, the control device includes: a die information storage section configured to store the position of each of the dies stored in the wafer supply device in association with a rank allocated to each of the dies; a block information acquisition section configured to acquire a condition of the dies to be mounted on a block provided on the board; a rank designation section configured to designate the rank of the die to be picked up by the component transfer device based on the content acquired by the block information acquisition section; and a position designation section configured to designate the position of the die to be picked up by the component transfer device based on the designation by the rank designation section and the content stored in the die information storage section. The position designation section designates the position of the die so that the die having the rank designated by the rank designation section is continuously picked up over the multiple wafers stored in the wafer supply device.

In addition, the present description discloses a second component mounting machine including a wafer supply device configured to supply a wafer divided into multiple dies to a supply position, a component transfer device configured to pick up the dies supplied to the supply position and to mount the dies on a conveyed board, and a control device configured to control the wafer supply device and the component transfer device.

In the second component mounting machine, the control device includes a die information storage section configured to store the position of each of the dies stored in the wafer supply device in association with a rank allocated to each of the dies, a block information acquisition section configured to acquire a condition of the dies to be mounted on a block provided on the board, a rank designation section configured to designate the rank of the die to be picked up by the component transfer device based on the content acquired by the block information acquisition section, and a position designation section configured to designate the position of the die to be picked up by the component transfer device based on the designation by the rank designation section and the content stored in the die information storage section. The rank designation section designates the dies in order from the dies having a rank in which the quantity to be stored in the wafer supply device is smallest.

With the first component mounting machine, the position designation section designates the position of the die so that the die having the designated rank is continuously picked up over the multiple wafers stored in the wafer supply device. Therefore, since the number of unused dies can be reduced in the component mounting machine, it is possible to efficiently supply components.

With the second component mounting machine, the rank designation section designates in order from the die having the rank with the smallest quantity stored in the wafer supply device. Therefore, the component mounting machine can suppress the occurrence of a pickup error.

BRIEF DESCRIPTION OF DRAWINGS

FIG. 9 is a table showing an example of processing performed by a rank-based die total number calculation section according to a second embodiment.

FIG. 10 is a table showing an example of processing performed by the rank-based die total number calculation section in the second embodiment, and shows a state after completing a rank designation in which die D of rank 8 and rank 9 is set as one unit.

DESCRIPTION OF EMBODIMENTS

1. First Embodiment 1-1: Configuration of Component Mounting Machine 1

Hereinafter, embodiments to which the component mounting machine according to the present disclosure is applied will be described with reference to the drawings. First, with reference to FIG. 1, a schematic configuration of component mounting machine 1 will be described.

Figure 1:
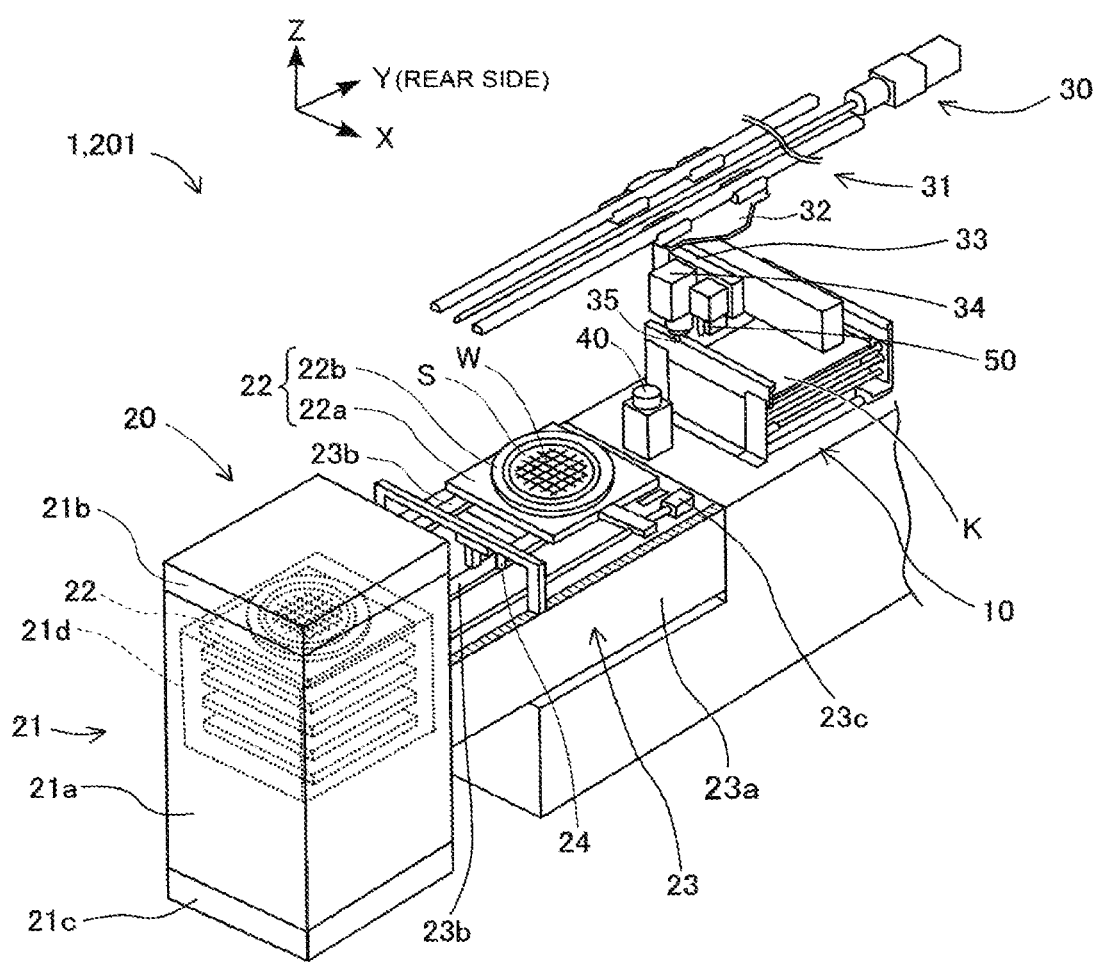
FIG. 1 is a perspective view of a component mounting machine according to a first embodiment disclosed in the present description.
Figure 3:
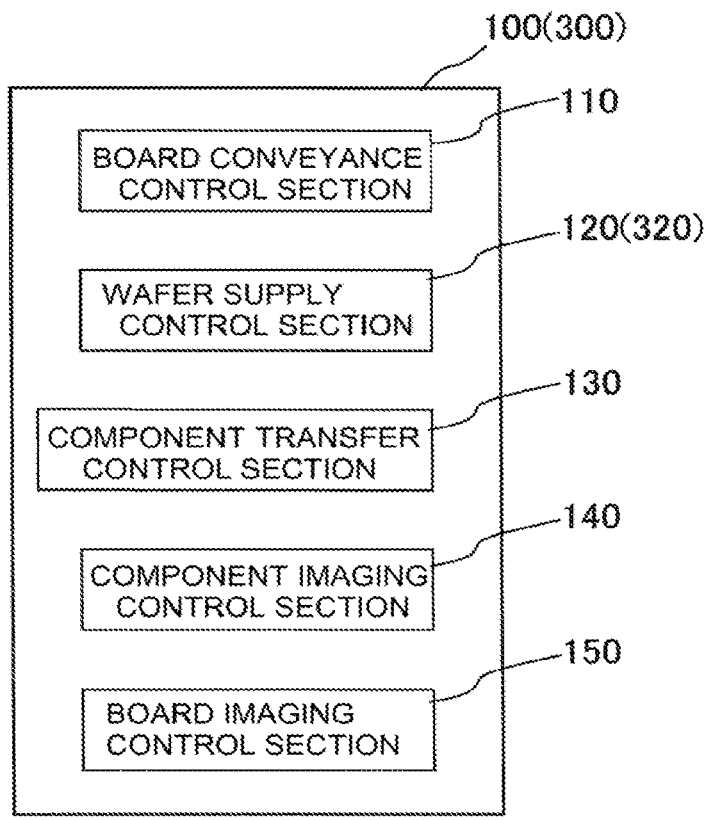
FIG. 3 is a block diagram of the component mounting machine.

As shown in FIG. 1, component mounting machine 1 mainly includes board conveyance device 10, wafer supply device 20, component transfer device 30, component imaging device 40, board imaging device 50, and control device 100 (see FIG. 3). In FIG. 1, the direction in which board K is conveyed is defined as the X-axis direction, and the horizontal direction orthogonal to the X-axis direction is defined as the Y-axis direction, and the vertical direction perpendicular to the X-axis direction and the Y-axis direction is defined as the Z-axis direction.

Board conveyance device 10 carries in and out board K on which a component is to be mounted. Board conveyance device 10 positions board K carried into the machine of component mounting machine 1, and after the components are mounted on board K, board K is carried out to the outside of the machine of component mounting machine 1.

Wafer supply device 20 mainly includes magazine storage section 21, multiple wafer pallets 22, pallet conveyance mechanism 23, and wafer imaging device 24. Magazine storage section 21 is formed by vertically long rectangular parallelepiped housing 21a, and can store multiple wafers W. Pallet carrying-in section 21b is provided at the upper portion of housing 21a, and pallet discharging section 21c is provided at the lower portion of housing 21a. Magazine 21d is stored in housing 21a. Magazine 21d is a box-shaped member having multiple storage racks and is provided so as to be vertically movable with respect to housing 21a. Each storage rack of magazine 21d stores wafer pallet 22 so that it can be pulled out. Wafer pallet 22 is carried in from pallet carrying-in section 21b, stored in magazine 21d, and discharged from pallet discharging section 21c after use.

Wafer pallet 22 includes pallet frame 22a and expanding table 22b. Pallet frame 22a is a frame body having a hole at the center, and expanding table 22b is an annular member provided around the hole on the upper face of pallet frame 22a. Expanding table 22b holds the periphery of dicing sheet S in a state where tension is applied to dicing sheet S. Wafer W divided into multiple dies D by a dicing process adheres to dicing sheet S.

Pallet conveyance mechanism 23 is provided behind magazine storage section 21. Pallet conveyance mechanism 23 mainly includes horizontally long rectangular parallelepiped main body section 23a, pair of guide rails 23b, and ball screw feed mechanism 23c. Wafer pallet 22 is pulled out from magazine 21d by ball screw feed mechanism 23c, and conveyed to the supply position along pair of guide rails 23b. Wafer pallet 22 at the supply position is returned to magazine 21d by ball screw feed mechanism 23c. FIG. 1 shows a state in which one wafer pallet 22 is conveyed to the supply position. Wafer imaging device 24 is a camera that images wafer W from above.

Figure 2:
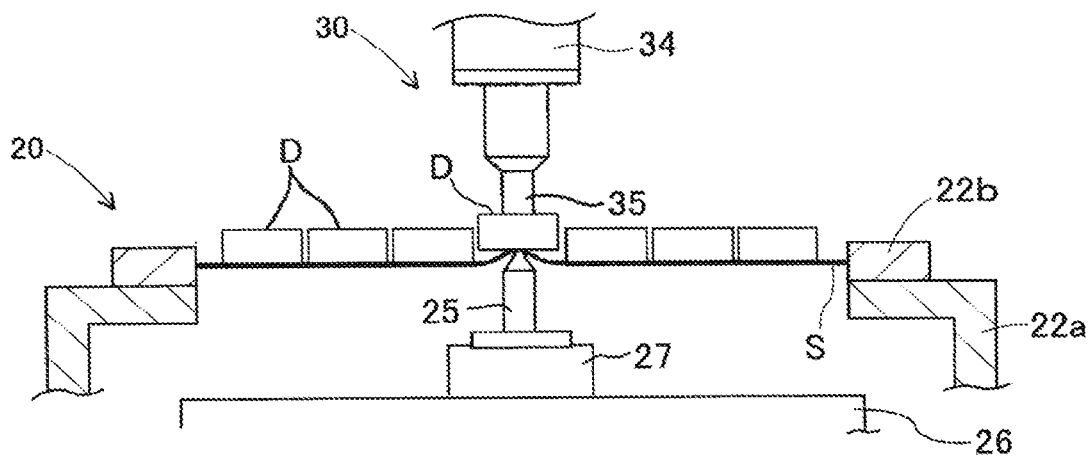
FIG. 2 is a view of a push-up pot of a wafer supply device from a side face.

As shown in FIG. 2, wafer supply device 20 further includes push-up pot 25, pot moving device 26, and pot lifting and lowering device 27. Push-up pot 25 pushes up die D together with dicing sheet S from below when die D is picked up.

Pot moving device 26 is disposed inside pallet frame 22a and is provided so as to be movable in the X-direction and the Y-direction (front-rear, left-right direction in FIG. 2). Pot lifting and lowering device 27 is provided on the upper face of pot moving device 26, and is provided so as to be vertically movable in the Z-direction (up-down direction in FIG. 2). Push-up pot 25 is provided on the upper face of pot lifting and lowering device 27, and pot lifting and lowering device 27 and push-up pot 25 move in the X-direction and the Y-direction along with the movement of pot moving device 26. Then, push-up pot 25 is lifted as pot lifting and lowering device 27 is lifted and pushes up die D from below via dicing sheet S.

In addition, component mounting machine 1 is provided with various motors (not shown) for driving wafer supply device 20. The various motors for driving wafer supply device 20 include motors for driving magazine 21d, pot moving device 26, and pot lifting and lowering device 27.

Returning to FIG. 1, the description will be continued. Component transfer device 30 mainly includes head driving device 31, moving body 32, and mounting head 33. Head driving device 31 is provided so as to be able to move moving body 32 in the X-axis direction and the Y-axis direction by a linear motion mechanism. Mounting head 33 is fixed to moving body 32 via a frame (not shown). Mounting head 33 holds die D, which is a component supplied to the supply position, and mounts die D to positioned board K. Mounting head 33 is detachably provided with holding tool 34, and holding tool 34 is provided with multiple rotatably and vertically movable component holding sections 35. Component holding section 35 is a nozzle for detachably holding die D by suction.

Component mounting machine 1 is provided with various motors (not shown) for driving component transfer device 30. Various motors for driving component transfer device 30 include an X-axis motor for moving moving body 32 in the X-axis direction, a Y-axis motor for moving moving body 32 in the Y-axis direction, an R-axis motor for rotating mounting head 33 about the Z-axis, and a θ-axis motor for rotating each of multiple component holding sections 35 about the Z-axis.

Component imaging device 40 is a camera provided between board conveyance device 10 and wafer supply device 20, and captures an image of die D held by component holding section 35 from below. Board imaging device 50 is a camera provided on moving body 32, and images board K from above.

As shown in FIG. 3, control device 100 mainly includes board conveyance control section 110, wafer supply control section 120, component transfer control section 130, component imaging control section 140, and board imaging control section 150. Board conveyance control section 110 causes board conveyance device 10 to carry in, position, and carry out board K. Wafer supply control section 120 performs general control on wafer supply device 20. Details of wafer supply control section 120 will be described later.

Component transfer control section 130 controls the position of moving body 32 and the suction pickup operation and the mounting operation of die D with component holding section 35 by performing drive control of various motors. Component imaging control section 140 performs imaging with component imaging device 40. In addition, component imaging control section 140 detects the holding position, the angle, and the like of die D held by component holding section 35 based on the image capturing result captured by component imaging device 40. Component transfer control section 130 changes the direction of die D held by component holding section 35 by controlling various motors as necessary. Board imaging control section 150 captures an image of the position mark attached to the surface of board K with board imaging device 50 and obtains an error in the mounting position of die D based on the image capturing result. Component transfer control section 130 controls various motors as necessary and corrects the mounting position of die D with respect to board K.

1-2: Wafer Supply Control Section 120

Figure 4:
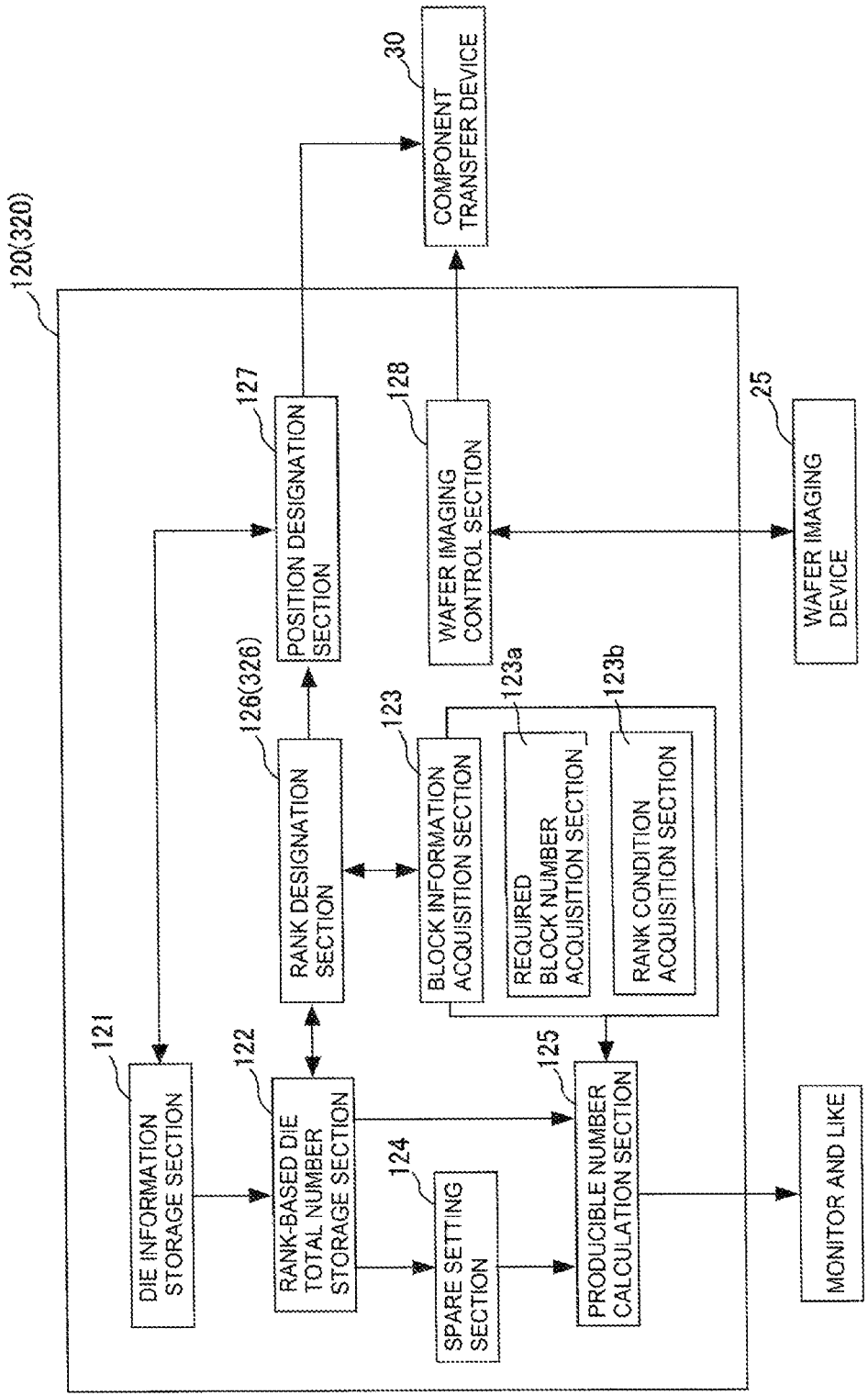
FIG. 4 is a block diagram of a wafer supply control section.

Next, wafer supply control section 120 will be described with reference to FIG. 4. As shown in FIG. 4, wafer supply control section 120 includes die information storage section 121, rank-based die total number storage section 122, block information acquisition section 123, spare setting section 124, producible number calculation section 125, rank designation section 126, position designation section 127, and wafer imaging control section 128.

Die information storage section 121 stores information on dies D included in all wafers W stored in magazine 21d. Here, before wafer W is stored in magazine 21d, each die D included in wafer W is ranked based on predetermined characteristics (such as resistance value and frequency). Die information storage section 121 stores information on the position of each of dies D stored in magazine 21d in association with a rank assigned to each of dies D. Wafer W is provided with a bar code associated with information on the position and rank of die D. Component mounting machine 1 reads the bar code with a bar code reader (not shown) provided in wafer supply device 20, thereby acquiring information on die D of each wafer W and storing the information in die information storage section 121.

Rank-based die total number storage section 122 stores the total number of dies D stored in magazine 21d by rank based on the content stored in die information storage section 121. Here, an example of the information stored in rank-based die total number storage section 122 will be described with reference to FIG. 5. Here, a case where three wafers W of the same type are stored in magazine 21d, and 1 to 9 ranks allocated according to characteristics are assigned to each die D, will be described as an example.

Figures 5, 6:
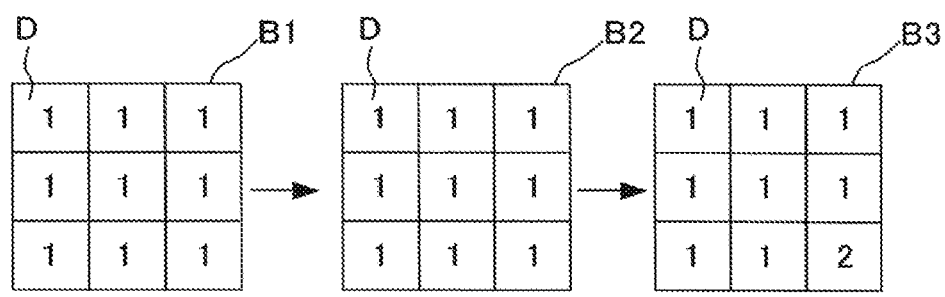
FIG. 5 is a table showing an example of information stored in a rank-based die total number storage section.
FIG. 6 is an example of blocks on which dies are mounted.

As shown in FIG. 5, wafer supply control section 120 acquires information on the rank of die D included in each of three wafers W1 to W3 stored in die information storage section 121. Subsequently, wafer supply control section 120 calculates the sum of dies D included in three wafers W1 to W3 for each rank and stores the calculated total number of dies D for each rank in rank-based die total number storage section 122. For example, in the example illustrated in FIG. 5, rank-based die total number storage section 122 stores that 26 (=14+0+12) dies D with rank 1 are stored in magazine 21d.

Returning to FIG. 4, the description will be continued. Block information acquisition section 123 acquires and stores information on board K conveyed to board conveyance device 10. More specifically, a block serving as a mounting position of die D is provided on the upper face of board K, and block information acquisition section 123 acquires and stores information on the condition of die D to be mounted on the block. The information on the condition of die D to be mounted on the block may be stored in advance as information on board K, or may be input by an operator.

Block information acquisition section 123 mainly includes required block number acquisition section 123a and rank condition acquisition section 123b. Required block number acquisition section 123a acquires and stores the required number of dies D to be mounted on one block. Rank condition acquisition section 123b acquires and stores a condition relating to the rank of die D to be mounted on one block.

Spare setting section 124 sets the number of spare dies D to be secured for recovery. That is, during the mounting work of die D, there is a concern that a component defect of die D, a pickup error by component holding section 35, or the like may occur. On the other hand, in component mounting machine 1, by securing die D for use in recovery in advance, even if a component defect, a pickup error, or the like occurs, it is possible to suppress the occurrence of a shortage in the number of dies D required for mounting the block. As a result, component mounting machine 1 can prevent an incomplete block from being generated due to a component defect, a pickup error, or the like.

The number of spare dies D to be set in spare setting section 124 may be set as an input value by an operator, or may be set as a value calculated based on a recovery rate inferred from past statistical data.

Producible number calculation section 125 calculates the number of producible blocks using dies D stored in magazine 21d based on the content acquired by block information acquisition section 123 and the content stored in rank-based die total number storage section 122. Producible number calculation section 125 calculates the producible number by subtracting in advance the number of spare dies D set in spare setting section 124 from the total number of dies D for each rank. Then, wafer supply control section 120 displays the calculated value of the producible number on, for example, a monitor or the like. In this case, the operator can obtain the number of producible blocks by checking the monitor or the like.

Rank designation section 126 designates the rank of die D picked up by component transfer device 30 based on the condition of die D acquired by block information acquisition section 123 and the content stored in rank-based die total number storage section 122. In the present embodiment, rank designation section 126 designates a single rank as the rank of die D to be picked up. As a result, component mounting machine 1 can simplify the control by rank designation section 126. As a rank designation procedure, rank designation section 126 designates dies D stored in magazine 21d in order from dies D having the smallest number by rank.

Position designation section 127 designates the position of die D to be picked up from among multiple dies D stored in magazine 21d. Wafer imaging control section 128 performs imaging with wafer imaging device 24. Wafer imaging control section 128 recognizes the accurate position of die D based on the image capturing result by wafer imaging device 24, and component transfer control section 130 performs movement control of component transfer device 30 based on the information obtained from wafer imaging control section 128.

1-3: Rank Designation Procedure by Rank Designation Section 126

Here, an example of the rank designation performed by rank designation section 126 will be described with reference to FIGS. 5 and 6. The rank-based number of each die D shown in FIG. 5 indicates the quantity after subtracting the number of the spare die D set in spare setting section 124.

Here, the required number of dies D mounted on one block is set to "9", and when dies D of different ranks are mixed in one block, "up to two adjacent ranks" is set as a condition. For example, when the ranks of dies D mounted on one block are all "rank 1" (same rank), or when the ranks of dies D mounted on one block are "rank 1 and rank 2" (two adjacent ranks), the above condition is satisfied. On the other hand, when the ranks of dies D mounted on one block are "rank 1 and rank 3" (rank is not adjacent) or "rank 1, rank 2, and rank 3" (three ranks are mixed), the above condition is not satisfied.

As shown in FIG. 5, when looking at dies D stored in magazine 21d by rank, die D of "rank 1" has the smallest total number of dies D. Therefore, rank designation section 126 designates "rank 1" as the rank of die D picked up by component transfer device 30. Then, position designation section 127 first designates the position of die D having "rank 1" from wafer W1.

Here, the required number of dies D per one block is "9". On the other hand, wafer W1 includes 14 dies D of "rank 1". That is, wafer W1 includes nine or more dies D having "rank 1". Accordingly, as shown in FIG. 6, die D mounted on first block B1 is supplied only by wafer W1.

After the mounting of die D on first block B1 is completed, the number of dies D of "rank 1" remaining on wafer W1 is five when the mounting of die D on second block B2 is started. That is, the number of dies D of "rank 1" remaining on wafer W1 is less than nine, and when attempting to pick up dies D of "rank 1" mounted on second block B2 from wafer W1, a shortage of four dies occurs. Therefore, rank designation section 126 determines whether four dies D of "rank 1" corresponding to the shortage can be supplied from among wafers W2 and W3 stored in magazine 21d.

In the example shown in FIG. 5, wafer W2 does not include die D having the "rank 1", but wafer W3 includes 12 dies D having the "rank 1". Therefore, in this case, first, position designation section 127 designates the position of die D of "rank 1" remaining on wafer W1 and mounts die D of "rank 1" in second block B2. Subsequently, after returning wafer W1 from the supply position to magazine 21d, wafer supply control section 120 conveys wafer W3 from magazine 21d to the supply position. Then, position designation section 127 designates the positions of the four dies D of "rank 1" from dies D of "rank 1" included in wafer W3. As a result, as shown in FIG. 6, only "rank 1" dies D supplied from wafers W1 and W3 are mounted on second block B2.

In this manner, position designation section 127 designates the position of die D so that die D having the rank designated by rank designation section 126 is continuously picked up over multiple wafers W stored in magazine 21d. As a result, component mounting machine 1 designates the positions of only dies D included in one wafer W as the targets and can reduce the number of unused dies D compared with the case of exchanging with new wafer W after the pickup for all the ranks is completed. Therefore, component mounting machine 1 can efficiently supply die D as a component.

After the mounting of die D to second block B2 is completed, when the mounting of die D to third block B3 is started, the remaining number of dies D of "rank 1" in wafer W3 is eight. That is, when the number of dies D of "rank 1" remaining on wafer W3 is less than nine and the attempt is made to pick up dies D of "rank 1" mounted on third block B3 from wafer W3, a shortage of one occurs. Further, even in wafer W1 and wafer W2 stored in magazine 21d, dies D having the "rank 1" do not remain.

In this case, rank designation section 126 supplements die D corresponding to the shortage with die D of "rank 2", which is a rank adjacent to "rank 1". As a result, as shown in FIG. 6, die D of the "rank 1" and die D of the "rank 2" are mounted in a mixed state on third block B3. In this case, die D of "rank 2" may be picked up from wafer W3, or may be picked up from wafer W1 or wafer W2.

As described above, when the total number of dies D having the rank to be designated in magazine 21d is less than the required number of dies D to be mounted on the block, position designation section 127 supplements the shortage of dies D in the block with dies D having a rank different from the rank to be designated and satisfying the condition to be mounted on the block when mounting to a new block is started. As a result, component mounting machine 1 can reduce the number of unused dies D and prevent the occurrence of incomplete blocks. In this case, if magazine 21d does not have remaining die D satisfying the condition to be mounted on the block, component mounting machine 1 stops picking up die D targeted for designation. Then, rank designation section 126 designates die D of a rank different from die D targeted for designation as the rank of die D picked up by component transfer device 30.

Here, die information storage section 121 stores wafer map data in which the position of die D on wafer W is associated with the rank of each die D. Position designation section 127 estimates the position of die D to be picked up based on the wafer map data and designates the position of die D. More specifically, position designation section 127 estimates the position of die D to be picked up next based on the position of die D picked up immediately before. Then, after moving pot moving device 26 to the estimated position, wafer supply control section 120 raises pot lifting and lowering device 27 to push up push-up pot 25 (see FIG. 2).

As a result, die D at the estimated position is pushed up, and the pushed up die D is picked up by component holding section 35. At this time, since die D is pushed up by push-up pot 25 for each dicing sheet S, stretching occurs in dicing sheet S at the portion where die D was picked up.

Figure 7:
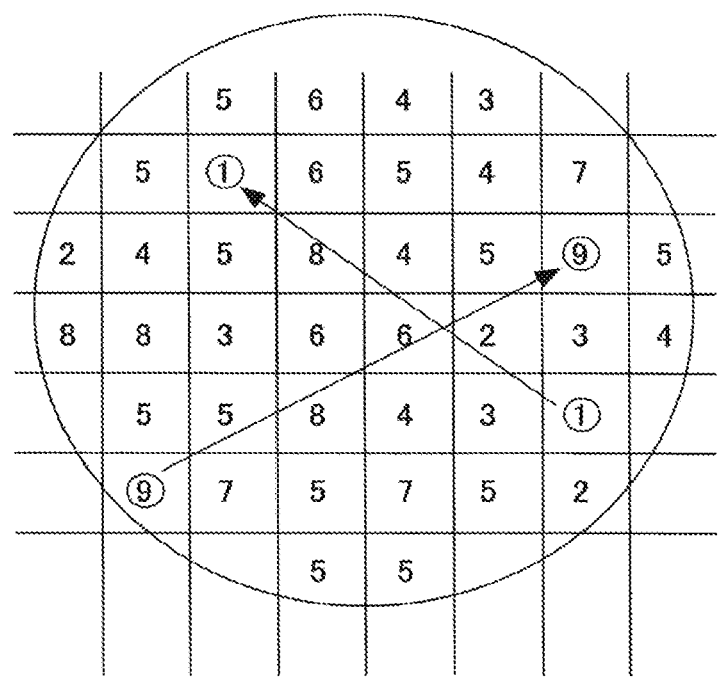
FIG. 7 is a diagram showing an example of position designation performed by a position designation section, and shows the order of position designation when the rank of a rank 1 die is designated and the order of position designation when the rank of a rank 9 die is designated.

In this regard, as shown in FIG. 7, dies D having a small number of dies by rank, such as dies D of "rank 1" and "rank 9", have a large distance between dies D having the same rank. Then, in a state where there are many portions where the dies D are picked up and stretching occurs in dicing sheet S between the dies D having the same rank, the distance between the dies D having the same rank is widened by an amount corresponding to the stretching of dicing sheet S. In such a case, since the error between the distance between dies D having the same rank and the distance estimated based on the wafer map data becomes large, a pickup error tends to occur.

In this regard, rank designation section 126 designates dies D stored in magazine 21d in order from dies D having the smallest number by rank. In this case, when picking up dies D having a small number of dies by rank, it is possible to prevent a state in which there are many portions where dies D are picked up and stretching occurs in dicing sheet S between dies D having the same rank. As a result, since the distance between dies D having the same rank can be prevented from spreading due to the stretching of dicing sheet S, component mounting machine 1 can suppress the occurrence of a pickup error.

Figure 8:
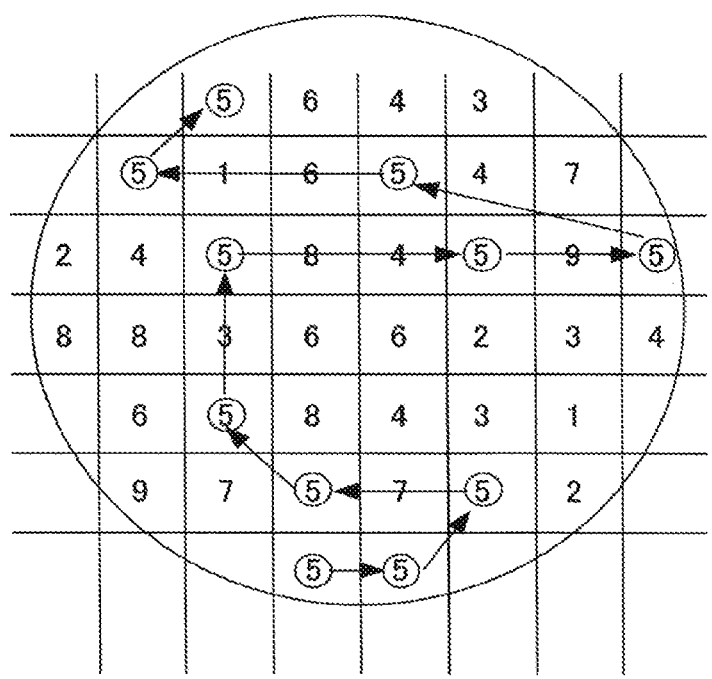
FIG. 8 is a diagram showing an example of a position designation performed by a position designation section, and shows the order of the position designation when the rank of a rank 5 die is designated.

On the other hand, as shown in FIG. 8, in the case of picking up a die D having a large number of dies by rank, such as die D of "rank 5", the distance between dies D having the same rank becomes shorter as compared with the case of picking up die D having a small number of dies by rank. As a result, it is possible to prevent dies D from being picked up and having many stretched portions on the dicing sheet S between dies D having the same rank. Therefore, component mounting machine 1 can suppress the occurrence of a pickup error.

As described above, component mounting machine 1 includes position designation section 127 that designates the position of die D to be picked up with respect to component transfer device 30 based on the designation by rank designation section 126 and the content stored in die information storage section 121. Then, position designation section 127 designates the position of die D so that die D having the rank designated by rank designation section 126 is continuously picked up over multiple wafers W stored in wafer supply device 20. As a result, since the number of unused dies D can be reduced in component mounting machine 1, it is possible to efficiently supply dies D as components.

In addition, since rank designation section 126 designates dies D stored in wafer supply device 20 in order from dies D having the smallest number by rank, component mounting machine 1 can suppress the occurrence of a pickup error.

Rank-based die total number storage section 122 stores the total number of dies D stored in wafer supply device 20 for each rank, and producible number calculation section 125 calculates the number of blocks producible by wafers W stored in wafer supply device 20. Therefore, the operator can obtain the number of blocks producible by wafers W stored in wafer supply device 20.

In addition, spare setting section 124 sets a part of dies D stored in wafer supply device 20 as spare die D used for recovery for each rank. Then, producible number calculation section 125 calculates the producible number of blocks in a state in which the number of spare dies D set in spare setting section 124 for each rank is subtracted from the total number of dies D stored in wafer supply device 20 for each rank. As a result, even if a component defect, a pickup error, or the like occurs, component mounting machine 1 can suppress the insufficiency of the number of dies D required for mounting the block. Therefore, component mounting machine 1 can prevent an incomplete block from being generated due to a component defect, a pickup error, or the like.

Further, since rank designation section 126 designates a single rank as the rank of die D to be picked up, component mounting machine 1 can simplify the control by rank designation section 126. Further, rank designation section 126 stops the designation of die D having the rank to be designated when the total number of dies D having the rank to be designated in wafer supply device 20 is less than the required number of dies D to be mounted on the block when the mounting of die D to the new block is started. As a result, component mounting machine 1 can simplify the control by rank designation sections 126 and 326.

2. Second Embodiment

Next, the second embodiment will be described. In the first embodiment, rank designation section 126 designates a single rank, and position designation section 127 designates the position of die D so that dies D of the single rank are continuously picked up. On the other hand, in the second embodiment, rank designation section 326 designates multiple ranks as one unit, and position designation section 127 designates the position of die D so that die D is picked up continuously for each unit. Components identical to those of the first embodiment are denoted by the same reference numerals, and descriptions thereof are omitted. Component mounting machine 201 in the second embodiment has the same configuration as component mounting machine 1 in the first embodiment except for the configuration of wafer supply control section 320 of control device 300.

2-1: Wafer Supply Control Section 320

First, wafer supply control section 320 according to the second embodiment will be described. Wafer supply control section 320 includes die information storage section 121, rank-based die total number storage section 122, block information acquisition section 123, spare setting section 124, producible number calculation section 125, rank designation section 326 (see FIG. 2), position designation section 127, and wafer imaging control section 128.

In the present embodiment, rank designation section 326 can designate multiple ranks as one unit as the rank of die D to be picked up. In the present embodiment, rank designation section 326 performs rank designation with two adjacent ranks (such as, rank 1 and rank 2, rank 3 and rank 4) as one unit as the rank of die D to be picked up. Position designation section 127 designates the position of die D so that die D is picked up continuously for each unit over all wafers W stored in wafer supply device 20. The procedure of the position designation by position designation section 127 is the same as that of the first embodiment.

2-2: Rank Designation Procedure by Rank Designation Section 326

Here, an example of the rank designation performed by rank designation section 326 will be described with reference to FIG. 9. The condition of die D to be mounted on the block is the same as that of the first embodiment. As shown in FIG. 9, when looking at dies D stored in magazine 21d by unit, the combination in which the total number of dies D is smallest is "rank 8 and rank 9". Therefore, rank designation section 326 designates "rank 8 and rank 9" as the rank of die D picked up by component transfer device 30. Then, position designation section 127 first designates the position of die D having the "rank 8 or 9" from wafer W1.

Here, the total number of dies D of "rank 8" and "rank 9" among dies D stored in magazine 21d is 82. Therefore, the rank of dies D mounted on the first to ninth blocks is only "rank 8 or rank 9".

Then, after the mounting of die D on the ninth block is completed, when the mounting of die D on the tenth block is started, the remaining number of dies D of "rank 8 or rank 9" in magazine 21d becomes one. That is, the remaining number of dies D of "rank 8 or rank 9" remaining in magazine 21d is less than nine, and eight dies D of "rank 8 or rank 9" are insufficient.

Therefore, when designating the position of die D with "rank 8 and rank 9" as one unit, position designation section 127 designates the position of die D so that die D of "rank 9" does not remain in magazine 21d when the mounting of die D with respect to the ninth block is completed.

Then, when the mounting of die D to the tenth block starts, position designation section 127 mounts die D having one "rank 8" remaining in magazine 21d, and then designates the position of die D so that die D of the "rank 7" which is a rank adjacent to the "rank 8" is picked up. As a result, since die D of the rank 8 and the rank 7 are mixed and mounted on the tenth block, the tenth block satisfies the condition of die D stored in block information acquisition section 123. In this manner, component mounting machine 201 can use die D having the "rank 8" and the "rank 9" stored in magazine 21d. Accordingly, since the number of unused dies D can be reduced in component mounting machine 201, it is possible to efficiently supply dies D as components.

Figure 11:
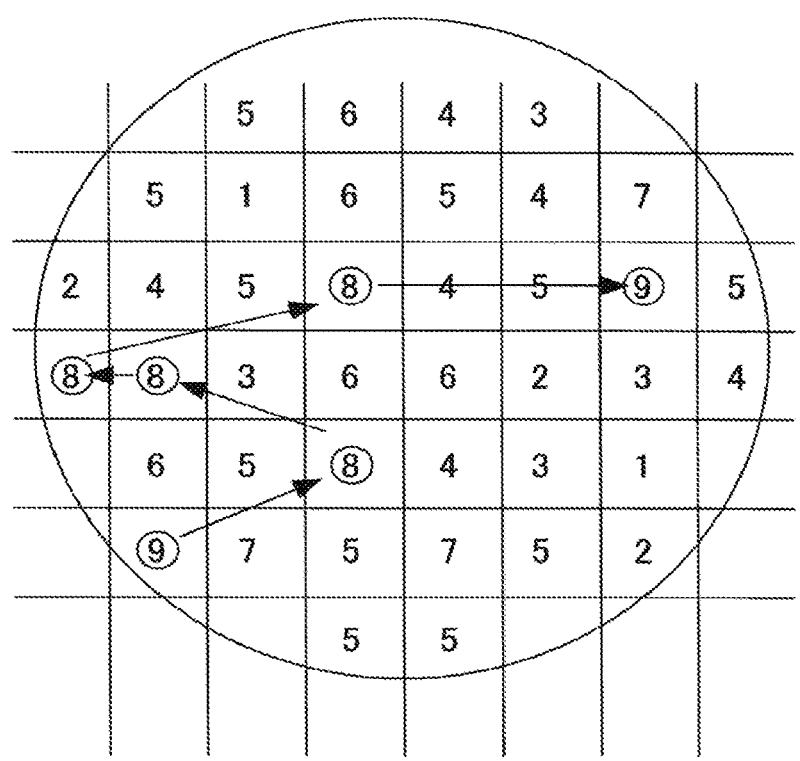
FIG. 11 is a diagram showing an example of a position designation performed by a position designation section, and shows the order of the position designation when the ranks of the die of rank 8 and rank 9 are designated as one unit.

Further, as shown in FIG. 11, since rank designation section 326 performs rank designation with two adjacent rank dies D as one unit, the distance between dies D to be picked up can be reduced as compared with the case where a single rank is designated as a rank. Therefore, component mounting machine 201 can suppress a pickup error. Further, component mounting machine 201 can reduce the number of times of exchange of wafer W supplied to the supply position, as compared with the case where a single rank is designated as a rank, and therefore, the mounting work efficiency of die D as a component can be improved.

3. Other

Although the present disclosure has been described based on the above-described embodiments, the present disclosure is not limited to the above-described embodiments, and it can be easily inferred that various modifications and improvements can be made within a range not departing from the scope of the present disclosure.

For example, in each of the embodiments described above, the present disclosure has been described as being applied to a case where multiple wafers W of the same type are stored in magazine 21d. However, the present disclosure is not limited to this, and can be applied even when one wafer W is stored in magazine 21d. Also in this case, since rank designation sections 126 and 326 designate dies D having ranks in which the quantity stored in magazine 21d is smallest in order, component mounting machines 1 and 201 can suppress the occurrence of a pickup error.

Further, in each of the above-described embodiments, the case where "up to two adjacent ranks" is used as an example of the rank mixture condition in the case where dies having different ranks are mixed and mounted on one block, but it is of course possible to change the rank condition. Further, for example, as a condition for mounting die D in one block, among the ranks of 1 to 9 included in wafer W, "only die D of a part of the ranks (for example, ranks 4 to 6) is mounted" may be added. In this case, since the number of unused dies D can be reduced in component mounting machines 1 and 201, it is possible to efficiently supply dies D as components.

In each of the above embodiments, a case is described in which, when the total number of dies D having the rank to be designated in magazine 21d is less than the required number of dies D to be mounted on the block, position designation section 127 supplements the shortage of dies D in the block with dies D having the rank different from the rank to be designated and satisfying the condition to be mounted on the block when mounting to a new block is started. However, the present disclosure is not limited thereto. For example, when the mounting of die D to the new block is started, if the total number of dies D having the rank to be designated in magazine 21d is less than the required number of dies D to be mounted on the block, the pickup of dies D having the rank to be designated may be stopped. In this case, component mounting machines 1 and 201 can simplify the control by position designation section 127.

Further, in the present embodiment, as a rank designation procedure performed by rank designation sections 126 and 326, a case is described in which designation is performed in order from die D having the smallest number by rank among dies D stored in magazine 21d. However, the present disclosure is not limited to this, and, for example, dies D may be mounted (in the order of rank 1, rank 2, rank 3, . . . rank 9) from die D having a smaller rank. Also in this case, position designation section 127 designates the position of die D so as to continuously pick up die D of the designated rank over multiple wafers W stored in wafer supply device 20. Therefore, since the number of unused dies D can be reduced in component mounting machines 1 and 201, the supply of dies D as components can be efficiently performed.

REFERENCE SIGNS LIST 1, 201: component mounting machine; 20: wafer supply device; 21d: magazine; 30: component transfer device; 100, 300: control device; 121: die information storage section; 122: rank-based die total number storage section; 123: block information acquisition section; 123a: required block number acquisition section; 124: spare setting section; 125: producible number calculation section; 126, 326: rank designation section; 127: position designation section; D: die; K: board; W: wafer

The invention claimed is:

1. A component mounting machine comprising:
a wafer supply device having a magazine capable of storing multiple wafers divided into multiple dies and configured to supply the wafers stored in the magazine to a supply position;
a component transfer device configured to pick up the dies supplied to the supply position and to mount the dies on a conveyed board; and
a control device configured to control the wafer supply device and the component transfer device, wherein the control device includes:
a die information storage section configured to store the position of each of the dies stored in the wafer supply device in association with a rank allocated to each of the dies;
a block information acquisition section configured to acquire a condition of the dies to be mounted on a block provided on the board,
a rank designation section configured to designate the rank of the die to be picked up by the component transfer device based on the content stored in the block information acquisition section, and
a position designation section configured to designate the position of the die to be picked up by the component transfer device based on the designation by the rank designation section and the content stored in the die information storage section,
wherein the position designation section designates the position of the die so that the die having the rank designated by the rank designation section is continuously picked up over the multiple wafers stored in the wafer supply device.

2. The component mounting machine according to claim 1,
wherein the rank designation section designates the dies stored in the wafer supply device in order from the dies having the smallest number by rank.

3. A component mounting machine comprising:
a wafer supply device configured to supply a wafer divided into multiple dies to a supply position;
a component transfer device configured to pick up the dies supplied to the supply position and to mount the dies on a conveyed board; and
a control device configured to control the wafer supply device and the component transfer device,
wherein the control device includes
a die information storage section configured to store the position of each of the dies stored in the wafer supply device in association with a rank allocated to each of the dies,
a block information acquisition section configured to acquire a condition of the dies to be mounted on a block provided on the board,
a rank designation section configured to designate the rank of the die to be picked up by the component transfer device based on the content acquired by the block information acquisition section, and
a position designation section configured to designate the position of the die to be picked up by the component transfer device based on the designation by the rank designation section and the content stored in the die information storage section,
wherein the rank designation section designates the dies in order from the dies having a rank in which the quantity to be stored in the wafer supply device is smallest.

4. The component mounting machine according to claim 1,
wherein the block information acquisition section includes a required block number acquisition section configured to acquire a required number of the dies to be mounted on the block, and
wherein the control device includes:
a rank-based die total number storage section configured to store the total number of the dies stored in the wafer supply device for each rank, and
a producible number calculation section configured to calculate the number of the blocks producible by the wafers stored in the wafer supply device based on the content acquired by the required block number acquisition section and the content stored in the rank-based die total number storage section.

5. The component mounting machine according to claim 4,
wherein the control device includes a spare setting section configured to set a part of the dies stored in the wafer supply device for each rank as the spare dies to be used for recovery, and
wherein the producible number calculation section calculates the producible number of the blocks in a state where the number of the spare dies set in the spare setting section for each rank is subtracted from the total number of the dies stored in the wafer supply device for each rank.

6. The component mounting machine according to claim 1,
wherein the rank designation section designates a single rank as a rank of the die to be picked up.

7. The component mounting machine according to claim 1,
wherein the rank designation section is capable of designating multiple ranks as one unit as a rank of the die to be picked up, and
wherein the position designation section designates a position of the die so that the die is continuously picked up for each unit over all the wafers stored in the wafer supply device.

8. The component mounting machine according to claim 1,
wherein the rank designation section stops designating the die of the rank to be designated in a case where the total number of the dies having the rank to be designated in the wafer supply device is less than the required number of the dies to be mounted on the block when mounting to a new block is started.

9. The component mounting machine according to claim 1,
wherein the rank designation section supplements a shortage of the die in the block with the die having a rank different from the rank to be designated and satisfying the condition to be mounted on the block in a case where the total number of the dies having the rank to be designated in the wafer supply device is less than the required number of the dies to be mounted on the block when mounting to a new block is started.

10. The component mounting machine according to claim 3,
wherein the block information acquisition section includes a required block number acquisition section configured to acquire a required number of the dies to be mounted on the block, and
wherein the control device includes:
a rank-based die total number storage section configured to store the total number of the dies stored in the wafer supply device for each rank, and
a producible number calculation section configured to calculate the number of the blocks producible by the wafers stored in the wafer supply device based on the content acquired by the required block number acquisition section and the content stored in the rank-based die total number storage section.

11. The component mounting machine according to claim 10,
wherein the control device includes a spare setting section configured to set a part of the dies stored in the wafer supply device for each rank as the spare dies to be used for recovery, and
wherein the producible number calculation section calculates the producible number of the blocks in a state where the number of the spare dies set in the spare setting section for each rank is subtracted from the total number of the dies stored in the wafer supply device for each rank.

12. The component mounting machine according to claim 3,
wherein the rank designation section designates a single rank as a rank of the die to be picked up.

13. The component mounting machine according to claim 3,
wherein the rank designation section is capable of designating multiple ranks as one unit as a rank of the die to be picked up, and
wherein the position designation section designates a position of the die so that the die is continuously picked up for each unit over all the wafers stored in the wafer supply device.

14. The component mounting machine according to claim 3,
wherein the rank designation section stops designating the die of the rank to be designated in a case where the total number of the dies having the rank to be designated in the wafer supply device is less than the required number of the dies to be mounted on the block when mounting to a new block is started.

15. The component mounting machine according to claim 3,
wherein the rank designation section supplements a shortage of the die in the block with the die having a rank different from the rank to be designated and satisfying the condition to be mounted on the block in a case where the total number of the dies having the rank to be designated in the wafer supply device is less than the required number of the dies to be mounted on the block when mounting to a new block is started.

* * * * *